Figure 1:
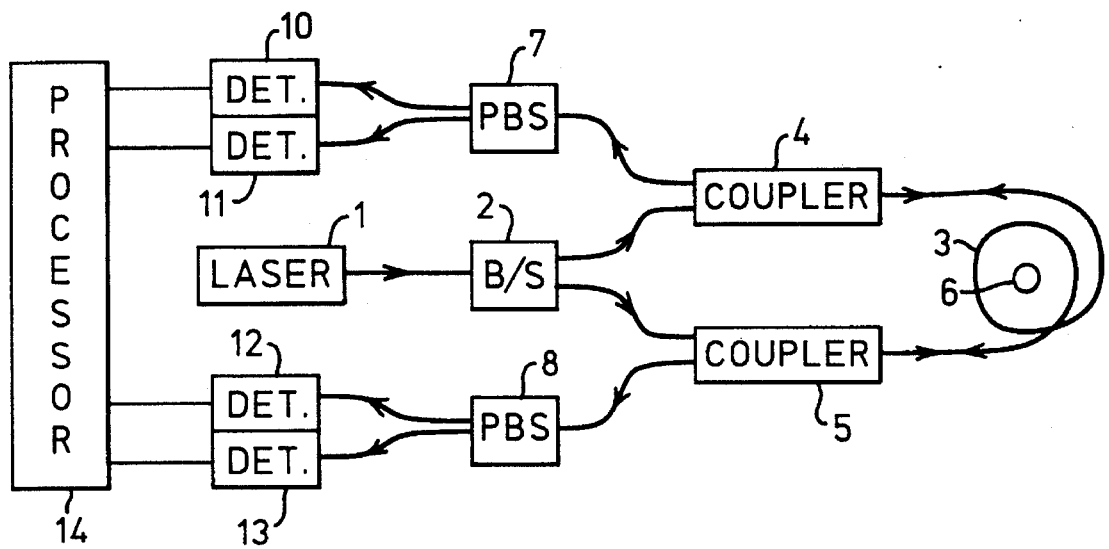

United States Patent [19]

Rogers

[11] Patent Number: 5,475,298
[45] Date of Patent: Dec. 12, 1995

[54] METHOD AND APPARATUS FOR MEASUREMENTS DEPENDENT ON THE FARADAY EFFECT USING POLARIZED COUNTER-PROPAGATING LIGHT

[75] Inventor: Alan J. Rogers, Bookham, England

[73] Assignee: British Technology Group Ltd., London, England

[21] Appl. No.: 87,805

[22] PCT Filed: Jan. 15, 1992

[86] PCT No.: PCT/GB92/00083

§ 371 Date: Oct. 29, 1993

§ 102(e) Date: Oct. 29, 1993

[87] PCT Pub. No.: WO92/13280

PCT Pub. Date: Aug. 6, 1992

[30] Foreign Application Priority Data

Jan. 16, 1991 [GB] United Kingdom ............... 9100924

[51] Int. Cl.[6] .................................................. G01R 19/00
[52] U.S. Cl. .................. 324/96; 324/117 R; 324/244.1
[58] Field of Search ...................... 324/73.1, 158 R, 324/158 D, 71.3, 96, 244.1, 117 R; 250/310, 311, 227.11, 227.14; 356/396, 400

[56] References Cited

U.S. PATENT DOCUMENTS

| | | | |
|---|---|---|---|
| 4,370,612 | 1/1983 | Puech et al. | 324/96 |
| 4,539,519 | 9/1985 | Ulrich et al. | 324/96 |
| 4,542,338 | 9/1985 | Arditty et al. | 324/117 R |
| 4,560,867 | 12/1985 | Papuchon et al. | 324/96 |
| 4,563,639 | 1/1986 | Langeac | 324/96 |
| 4,563,646 | 1/1986 | Desomiere | 324/244 |
| 4,796,607 | 1/1989 | Dupraz | 324/96 |

FOREIGN PATENT DOCUMENTS

| | | |
|---|---|---|
| 0108671 | 5/1984 | European Pat. Off. . |
| 356670 | 3/1990 | European Pat. Off. . |
| 2485204 | 12/1981 | France . |
| 2475230 | 2/1982 | France . |
| 3132414 | 2/1983 | Germany . |
| 2104213 | 3/1983 | United Kingdom . |
| 2168807 | 6/1986 | United Kingdom . |
| 2197067 | 5/1988 | United Kingdom . |
| 9101501 | 2/1991 | WIPO . |

OTHER PUBLICATIONS

Rogers, A. J., "Polarisation Optics for Monomode Fibre Sensors", IEEE Proceedings, Oct. 1985, vol. 132, Pt. J, No. 5, pp. 303–308.
Gambling et al., "Optical Fibers for Sensors", Optical Fiber Sensors, vol. 1, Artech House, 1988, pp. 249–276.
Varnham, Birch and Payne, "Design of Helical Core Circularly Birefringent Fibres", pp. 68–69.
Varnham, Birch and Payne, "Helical–Core Circularly–Birefringent Fibres", IOOC–ECOC, 1985, pp. 135–138.
Bergh, Lefevre & Shaw, "Geometrical Fiber Configuration for Isolators and Magnetometers", Stanford University, pp. 400–403.

Primary Examiner—Vinh P. Nguyen
Attorney, Agent, or Firm—Cushman, Darby & Cushman

[57] ABSTRACT

Measurements, particularly of current, using the Faraday magneto-optic effect in an optical fibre, have suffered from inaccuracy due to vibration causing linear birefringence in the fibre. Current measurement according to the method and apparatus employs an optical fibre (3) coiled round a conductor (6) carrying the current to be measured. A laser (1) launches two counter propagating light beams into the fibre by way of a beam splitter (2) and directional couplers (4,5). Polarization beam splitters (7,8) derive two pairs of orthogonally linearly polarized light beams, one from each direction of propagation. These beams are passed to detectors (10,11, 12,13) having outputs coupled to a processor (14). An output signal is derived by the processor which is representative of the non-reciprocal Faraday rotation but independent of reciprocal birefringent effects, including linear birefringence due to vibration. Thus the output signal is representative of current in the conductor.

23 Claims, 1 Drawing Sheet

METHOD AND APPARATUS FOR MEASUREMENTS DEPENDENT ON THE FARADAY EFFECT USING POLARIZED COUNTER-PROPAGATING LIGHT

This invention relates to measurement methods and apparatus dependent on the Faraday effect; that is the rotation of the direction of polarization of light in a magneto-optic medium when a magnetic field is applied in the direction of propagation.

The invention is particulary useful for sensing the magnitude of an electric current flowing in a conductor by sensing the rotation of polarization of light in an optical fibre wound around the conductor.

Optical fibre measurement devices offer several important advantages for electrical power system applications.

Amongst other parameters which may be measured are magnetic field strength, voltage, temperature and strain or pressure.

The advantages of using an optical fibre technique to measure current in electricity supply systems are that electrically passive devices may be used and the sensor is free from electromagnetic interference and saturation effects. The optical fibre acts both as the transducer element and an insulating telemetry medium and may be interfaced easily to long distance communications links. It is also possible to measure a large bandwidth, typically up to 10 MHz. In optical fibre systems the costs are low and are not strongly dependent on the system voltage, as is the case for conventional current transformers.

In known optical fibre current measurement devices, such as are described in patent specifications EP 356670, FR 2475230 and U.S. Pat. No. 4,563,639, a laser beam is linearly polarized and is launched into a single-mode fibre which loops one or more times around a conductor which carries a current. The fibre then returns to a ground based detector system. Cladding modes are stripped off and the linearly polarized light propagating in the fibre core has its polarization direction rotated by the longitudinal magnetic field around the loop, via the action of the Faraday magneto-optic effect. The magnitude of the final rotation p is proportional to the line integral of the magnetic field H around n loops $$\rho = Vn \int H \cdot dl$$

where V is the Verdet constant (i.e. magneto-optic constant) for the fibre material. But, by Ampere's circuit theorem $$\int H \cdot dl = I$$

where I is the current enclosed by one loop. Thus $$\rho = VNI$$

This is true regardless of the size or shape of the conductor within the loop and the conductor may vibrate without affecting the magnitude of the rotation.

The resulting rotation may be sensed with, for example, the aid of a Wollaston prism, which resolves the emerging light signal into two orthogonal, linearly polarized components. Each of these components is separately detected with a photodiode, and the difference between the two intensities is normalized to their sum, to give a parameter P which is proportional to the polarization rotation, $\rho$,
$P = (I_1 - I_2)/(I_1 + I_2) = K\rho$
where K depends only on fibre properties. Thus the output is rendered independent of received light power, and hence of laser drift and variations in path attenuation.

The device is capable of a.c. and d.c. measurement.

The primary difficulty which exists with optical fibre current measurement devices for operational use is the sensitivity of the fibre to variations in propagation conditions, such as temperature or pressure variations. Some known current measurement devices make use of the fact that the Faraday rotation is non-reciprocal, that is, the absolute sense of tile rotation of the polarization direction is constant with respect to the direction of the longitudinal magnetic field and is independent of the direction of the propagation of the light. This has the effect of reversing the sign of the of Faraday rotation with a reversal of the light propagation direction. The devices described by patent specifications GB 2104213, U.S. Pat. No. 4,539,519, U.S. Pat. No. 4,560,867 and WO 91/01510 all reflect a linearly polarized laser beam which has been launched into magneto-optical medium back along the same path in order to cancel out any reciprocal effects, either intrinsic or induced. The devices described in patent specifications U.S. 4,563,646, U.S. Pat. No. 4,542,338 and U.S. Pat. No. 4,370,612 use two beams of light which propagate in opposite directions through the magneto-optical medium. However, a persistent and universal problem is that of vibrational noise, which can be prohibitively large in many power system applications.

The effect of vibration is to exert pressure on the fibre, thus inducing an asymmetrical strain within it. The primary consequence of this strain, in most practical situations, is to introduce a transverse asymmetry caused by a force component acting normally to the fibre axis. This asymmetry induces a linear birefringence, $\delta$, into the fibre.

If a Faraday rotation, $\rho$, is to be measured in the presence of a linear birefringence the assumption that both of these quantities are uniformly distributed throughout the length of the fibre may be made. If light is launched into an optical fibre, that light having its polarization state defined by the electric field components in the directions of the linear birefringence axes, OX (slow) and OY (fast), of the fibre, the light can be defined by $$E_x = e_x \exp i \omega t$$

$$E_y = e_y \exp i (\omega t + \phi) \tag{1}$$

Jones matrix calculus may be used to determine the components $E_x'$ and $E_y'$ of the light emerging from the fibre;

$$\begin{bmatrix} E_x' \\ E_y' \end{bmatrix} = \exp(-i\eta) \begin{bmatrix} \alpha + i\beta & -\gamma \\ \gamma\alpha & -i\beta \end{bmatrix} \begin{bmatrix} e_x \\ e_y\cos\phi - e_y\sin\phi \end{bmatrix} \tag{2}$$

where, $$\alpha = \cos(\Delta/2) \tag{3}$$

$$\beta = (\delta/2) \cdot \frac{\sin(\Delta/2)}{\Delta/2}$$

$$\gamma = \rho \cdot \frac{\sin(\Delta/2)}{\Delta/2}$$

$$\Delta = (\delta^2 + 4\rho^2)^{1/2} \tag{4}$$

and $$\alpha^2 + \beta^2 + \gamma^2 = 1$$

$\eta$ refers to the absolute phase delay imposed by the fibre and is common to both polarization components. $\Delta$ represents the phase delay inserted by the fibre between its two polarization eigenmodes, as described by A.J. Rogers, 1985, Proc IEE, J. 132, 303, 'Polarisation Optics for Monomode Fibre Sensors'.

If a polarization analyzer is placed at the output of the fibre and is set with its acceptance axis at an angle $\theta$ to the slow OX axis, using equation (2), the light passed by this analyzer is given by $$I_\theta = [e_x^2(\alpha^2 + \beta^2) + \gamma^2 e_y^2 - \qquad (5)$$

$$2e_x e_y \gamma(\alpha\cos\phi - \beta\sin\phi)]\cos^2\theta + [e_x^2\gamma^2 + e_y^2(\alpha^2 + \beta^2) +$$

$$2e_x e_y \gamma(\alpha\cos\phi - \beta\sin\phi)]\sin^2\theta + [\alpha\gamma(e_x^2 - e_y^2) -$$

$$2\alpha\beta e_x e_y \sin\phi + e_x e_y(\alpha^2 - \gamma^2 - \beta^2)]\sin 2\theta$$

In equation (5) above, nowhere do $\rho$ or $\delta$ appear as separate variables, and it is not possible to obtain a light intensity which is a direct measure of either one.

If light polarized in the OX direction is launched into the fibre and a polarization analyzer is set at an angle $\theta = \pi/4$, then $$e_x = 1 \quad e_y = 0 \quad \theta = \pi/4$$

hence, from equation 5

$$I_{\pi/4} = e_x^2 \left[ \frac{1}{2} + \rho \frac{\sin\Delta}{\Delta} \right]$$

Similarly, for a polarization analyzer at $-45°$ to the OX direction $$I_{-\pi/4} = e_x^2 \left[ \frac{1}{2} - \rho \frac{\sin\Delta}{\Delta} \right]$$

By replacing $I_1$ and $I_2$ with $I_{90/4}$ and $I_{-\pi/4}$ in the above equation for parameter P, $$P = \left( \frac{I_{\pi/4} - I_{-\pi/4}}{I_{\pi/4} + I_{-\pi/4}} \right) \qquad (6)$$

$$\text{if } \delta \gg 2\rho \text{ then } P \simeq 2\rho \frac{\sin\delta}{\delta} \qquad (7a)$$

$$\text{if } \delta \ll 2\rho \text{ then } P \simeq \sin 2\rho \qquad (7b)$$

It is the situation described by 7a which illustrates the vibrational problem since quite modest vibrational levels will lead to $\delta \gg 2\rho$, as is now shown.

The change in refractive index induced by stress in a medium is given by Yarviv, A., 1976, in "Introduction to Optical Electronics", (New York: Holt, Reinhart & Winston) on page 346, $$\Delta n = -(\eta^3 p/2)\sigma$$

where $\eta$ is the (unperturbed) refractive index, $\sigma$ the strain and P the photo-elastic constant for the material concerned. For silica, $p = 0.2$, and thus $$\Delta n = 0.311\sigma$$

If $\Delta n$ refers to a linear birefringence induced by a linear transverse strain $$\delta = (2\pi/\lambda) 42\, n\, 1 \qquad (9)$$

Where 1 is the fibre length $\lambda$ and the wavelength of the propagating light. Now the Verdet constant for silica is $0.15°$ kA$^{-1}$ at 850 nm wavelength, so that $\rho$ has a value of $10°$ at 67 kA, which is as large a current as is ever likely to be required for accurate measurement in practice. Thus the condition $\delta \gg 2\rho$ translates into $\delta > 200°$. For a fibre loop of radius 0.15 m the fibre length is ~1 m, and, in order to induce a linear birefringence ($\delta$) of $\pi$ (180°) over such a length, from (9)

$$\Delta n = \lambda/2 = 4.25 \times 10^{-7}$$

(It should also be noted that this birefringence is very much greater than the bend birefringence for such a radius, this latter being ~10°)

Using this value of $\Delta n$ in (8), $\sigma = 13.67 \times 10^{-7}$, say ~10$^{-6}$.

Now a strain of $10^{-6}$ is produced by a transverse vibrational amplitude of only $10^{-10}$ m in the fibre. Alternatively it may be produced by a stress ~$10^5$ N m$^{-2}$, this latter corresponding to a weight of ~30 g distributed uniformly over the fibre length; or to an impinging sound-wave intensity ~$10^{-16}$ W m$^{-2}$, which is on the lower limit of human audibility.

It is clear, then, that quite modest environmental influences can produce significant values of $\delta$ which, via equation (7a), will lead to a significant effect on the measured value of P. For example, as $\delta$ varies from zero to $\pi$, so P will vary from sin $2\rho$ to zero. If the environmental effects are time-varying in nature (that is, vibrations) the result will be a detection noise level which will limit device performance.

It is an object of this invention to provide a method and apparatus which enables the Faraday rotation induced in a magneto-optical medium to be measured independently of any linear birefringence effects and thus independent of vibrational noise.

It is known to use a fibre with high circular birefringence to reduce the effects of linear birefringence (W.A. Gambling & S.B. Poole, Optical Fibre Sensors, Vol. 1, Artech House, 1988, pp 249–276 and specification GB2168807). As described in specification GB 2104213, a single mode optical fibre is twisted about its own axis and a linearly polarized light is launched into the fibre and then reflected back along the same path in order to cancel out any reciprocal effects, such as circular birefringence.

According to a first aspect of the present invention there is provided a method of measurement comprising passing polarized counter propagating light beams through aptical guide means which exhibit Faraday rotation of polarized light in the presence of a magnetic field, applying a component of a magnetic field longitudinally of the directions of light propagating in the guide means, the guide means having high circular birefringence compared with the Faraday rotation of the polarization of the light beams due to the component, deriving first light-dependent signals from light received after passing through the guide means in one propagation direction only and second light-dependent signals derived from light received after passing through the guide means in the other propagation direction only, the first and second signals being dependent on the polarization states of light received and allowing an output signal to be derived which is dependent on Faraday rotation but not on reciprocal polarization effects, and deriving the output signal from the first and second light-dependent signals as representative of a quantity to be measured.

According to a second aspect of the present invention there is provided measurement apparatus comprising means for passing polarized counter propagating light beams through optical guide means which exhibit Faraday rotation of polarized light in the presence of a magnetic field component applied longitudinally of the directions of light propagating in the guide means, detector means for deriving first and second light-dependent signals from light received after passing through the guide means in one propagation direction and the other propagation direction, respectively, the first and second signals being dependent on the polarization states of light received and allowing an output signal to be derived which is dependent on Faraday rotation but not on reciprocal polarization effects, and processing means for deriving the output signal from the first and second light-dependent signals as representative of a quantity to be measured.

The guide means may comprise an optical fibre which exhibits the magneto-optic effect.

Usually the counter-propagating light beams are linearly polarized but this is not essential so long as the polarization state is known or can be determined.

The method or apparatus of the invention may be used for current measurement when the current to be measured applies the magnetic component. For such measurements the guide means is preferably in the form of an optical fibre coiled round a conductor carrying the current. In other arrangements other parameters, such as those mentioned above, may be measured. Voltages may be measured by deriving a current dependent thereon and magnetic field measurements may be made using the apparatus of the invention with the magnetic field to be measured applying the magnetic-field component. If the Verdet constant is dependent on temperature, the output signal indicates temperature provided the current is kept constant, and strain can be measured if the linear birefringence is made dependent on strain.

Each of the first and second signals may comprise a pair of polarization-dependent first and second signals dependent on light polarized in first and second polarization directions selected to allow the required output signal to be derived.

Preferably the said first polarization direction is at an angle of $\pi/4$ to the direction of polarization of light transmitted to the guide means, and the second polarization direction is at an angle of $\pi/2$ to the first polarization direction.

An important advantage of the invention is that the problem of vibration in current measurement is greatly reduced. The circular birefringence of the guide means is much greater than the magnetic field induced circular birefringence but the effect of the reciprocal birefringence is substantially removed by deriving the output signal from the two pairs of polarization-dependent signals.

If the circular birefringence of the guide means is also large compared with linear birefringence, any effects on the output signal of changes in linear birefringence along the guide means are significantly reduced.

Returning to the vibrational problem, information exists in the output polarization state of light experiencing Faraday rotation which allows unambiguous separation of linear and circular birefringence effects. This can be appreciated via an eigenmode approach from the inventor's above mentioned paper. The polarization eigenmodes are those two orthogonal elliptical polarization states, of the same ellipticity (except for sign) which propagate, without change of form, through the fibre. These states may be identified experimentally. The phase difference inserted between them by the fibre is, as has been stated, the parameter $\Delta$. The ellipticity of the states is given by:

$$\chi = \pm \tan\psi / \tan 2\psi = 2\rho/\delta$$

and the ellipticity can readily be measured (via Stokes parameters, for example). Thus, measured values may be obtained of the quantities $(\delta^2 + 4\rho^2)^{1/2}$ and $2\rho/\delta$ which thus allows $2\rho$ and $\delta$ to be separately determined (within an ambiguity of $2\pi$).

A theoretical explanation of the invention now follows.

Where light launched into an optical fibre is linearly polarized at an angle k to the OX axis with an amplitude A,
$\phi = 0$
$e_x = A \cos k$
$e_y = A \sin k$
By substituting for $e_x$ and $e_y$ in equation (4) then $$\frac{I_\theta}{A^2} = \alpha^2 \cos^2(k-\theta) + \beta^2 \cos^2(k+\theta) + \gamma^2 \sin^2(k-\theta) - \alpha\gamma \sin 2(k-\theta)$$

If $(k-\theta) = \pi/4$, which corresponds to a condition where the analysing polarizer is at $\pi/4$ to the input polarization direction then $$\frac{I_\theta}{A^2} = i_\theta = Q + \frac{\gamma^2}{2} - \alpha\gamma$$

where $$Q = \frac{\alpha^2}{2} + \beta^2 \cos^2(k+\theta)$$

If two linearly polarized counter-propagating beams are launched into a fibre which has a high circular birefringence $\rho_o$, such that $\rho_o >> \rho$, then the received beams $i_\theta^+$ and $i_\theta^-$ will be given by $$i_\theta^+ = Q + \frac{\gamma_+^2}{2} - \alpha\gamma_+$$

$$i_\theta^- = Q + \frac{\gamma_-^2}{2} - \alpha\gamma_-$$

and from equation 4

$$\Delta_+ = [\delta^2 + 4(\rho_o + \rho)^2]^{1/2}$$

$$\Delta_- = [\delta^2 + 4(\rho_o - \rho)^2]^{1/2}$$

Since $\rho_o >> \rho$
and therefore from equation 3

$$\gamma_+ = (\rho_0 + \rho) \cdot \frac{\sin(\Delta/2)}{\Delta/2}$$

and $$\gamma_- = (\rho_0 - \rho) \cdot \frac{\sin(\Delta/2)}{\Delta/2}$$

Similarly, if the polarization analyzer is rotated through an angle of $\pi/2$ then the intensities raised under these conditions are given by, $$i_{(\theta+\pi/2)}^+ = Q + \frac{\gamma_+^2}{2} - \alpha\gamma_+$$

$$i_{(\theta+\pi/2)}^- = Q + \frac{\gamma_-^2}{2} - \alpha\gamma_-$$

By using a pair of polarization analyzer placed with their acceptance axes at $\pi/2$ to each other to detect the light intensities of a received beam, then the intensity for each direction propagation is given by $i=i_{(\theta+\pi/2)}-i_{74}$. By substituting for $I_1$ and $I_2$ in the equation for the parameter P, the function may be evaluated to give a parameter S which is independent of any linear birefringence $\delta$, $$S = \frac{(i^-_{(\theta+\pi/2)} - i^-_\theta) - (i^+_{(\theta+\pi/2)} - i^+_\theta)}{(i^-_{(\theta+\pi/2)} - i^-_\theta) + (i^+_{(\theta+\pi/2)} - i^+_\theta)} = \frac{\rho}{\rho_0}$$

The parameter S is thus independent of $\delta$, and hence is free from the effect of vibrationally-induced linear birefringence and bend induced linear birefringence (including its temperature variation). If $\rho_o$ is made much greater than $\delta$, S is also free of the effects of intrinsic linear birefringence.

In suitable fibres, where the Verdet constant is independent of temperature, the Faraday effect, $\rho$, is independent of temperature. However, the temperature dependence of the circular birefringence, $\rho_o$, causes a slow drift in the parameter S but use of a fibre which has a Faraday effect with the same temperature dependence overcomes this problem.

$\rho_o$ can be obtained to a good approximation by noting that if $\rho = \pi/4$ and $\theta = 0$ $$i_\theta^+ \approx i_\theta^- \approx \tfrac{1}{2} - 2\alpha\gamma$$

and $$i_{(\theta+\pi/2)}^+ \approx i_{(\theta+\pi/2)}^- \approx \tfrac{1}{2} + 2\alpha\gamma$$

Hence $$i_{(\theta+\pi/2)}^+ - i_\theta^+ \approx i_{(\theta+\pi/2)}^- - i_\theta^- \approx 2\alpha\gamma \approx \sin 2\rho_o$$

Hence $$T = \sin^{-1}(i_{(\theta+\pi/2)}^+ - i_\theta^+) = \sin^{-1}(i_{(\theta+\pi/2)}^- - i_\theta^-) \approx 2\rho_o$$

The parameter T can be used as a multiplier for S to provide a value for $\rho$ which is independent of $\rho_o$ and thus of temperature.

Figure 2:
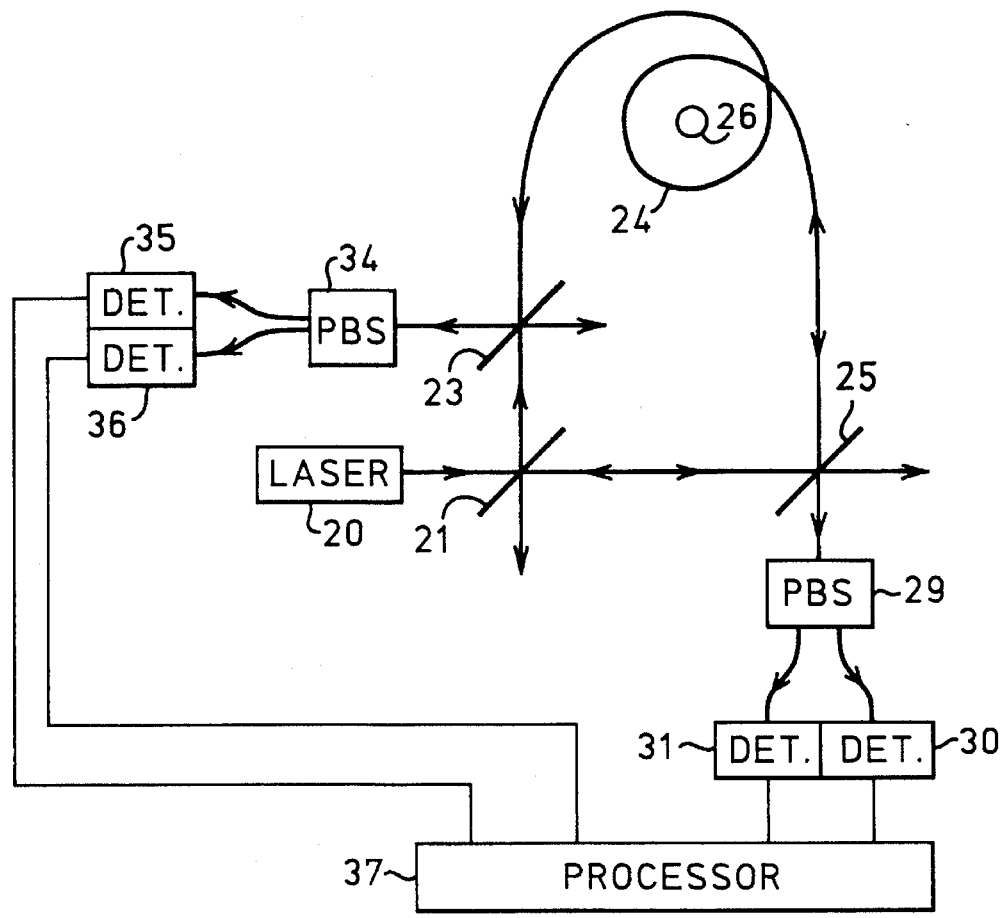

Embodiments of the invention will now be described by way of example with reference to the accompanying drawings, in which, FIGS. 1 and 2 are block diagrams of different embodiments of the invention.

Referring now to FIG. 1, a laser (1) producing linearly polarized light is coupled to a beam splitter (2). The beam splitter splits the beam of laser light into two beams, which are then coupled to an optical fibre loop (3) by two directional couplers (4) and (5) so that the two beams take opposite paths around an optical fibre loop. The optical fibre loop is wound round a conductor (6) which carries a current to be measured and induces in the fibre loop a longitudinal magnetic field, causing the plane of each polarized laser beam to be rotated. The optical fibre of the loop has a very high circular birefringence which also causes the plane of the polarized light to be rotated. Such fibres can be produced, for example, by twisting the fibre or by spinning the preform for a hi-bi fibre as the fibre is drawn as is explained in "Optical Fibres for Sensors", Optical-Fibre Sensors, Vol. 1, by Gambling, W.A. and Poole, S.B., published by Artech House, 1988, see pages 249 to 276. A circular birefringence which gives a beat length in the range 0.5 to 5 cm is expected to fulfil the requirement that it is very much greater than the induced circular birefringence due to the Faraday effect.

The two emerging beams are coupled via the directional couplers (4) and (5) to two polarization beam splitters (7) and (8) respectively, giving four beams. Each polarization beam splitter is coupled to a pair of light sensitive detectors (10) and (11), and (12) and (13), respectively. The polarization beam splitters each provide two beams, each of which is linearly polarized and orthogonal to the other. The polarization beam splitters 7 and 8 are set so that directions of polarization of the two beams are at $\pm\pi/4$ to the direction of polarization of light from the laser (1). Thus the values of $i_\theta^+$, $i_{(\theta+\pi/2)}^+$, $i_\theta^-$ and $i_{(\theta+\pi/2)}^-$ can be determined. These values are passed to a processor (14) which determines the parameter S, the angle of the Faraday rotation and therefore the current flowing in the conductor.

Referring to FIG. 2, in an alternative arrangement, a laser (20) producing a linearly polarized beam of light is coupled to a beam splitter (21) producing two beams. One of the beams passes by way of a beam splitter 23 to one end of an optical fibre loop (24) and the other beam passes by way of another beam splitter 25 to the other end of the optical fibre loop, where the two beams take opposite, counter-propagating paths. The optical fibre loop is wound round a conductor (26) which carries a current to be measured and induces in the fibre loop a longitudinal magnetic field, causing the plane of each polarized laser beam to be rotated. The optical fibre loop has a very high circular birefringence which also causes the plane of the polarized light to be rotated. The clockwise beam emerging from the fibre loop (24) passes to the beam splitter (25) and then to a polarization beam splitter (29), giving two beams. The two beams are coupled to a pair of light sensitive detectors (30) and (31). The anti-clockwise beam emerging from the fibre loop (24) passes to the beam splitter (23) and then the transmitted beam reaches a polarization beam splitter (34), giving two beams which are coupled to a pair of light sensitive detectors (35) and (36). The polarization beam splitters (29) and (34) are set up in the same way as the polarization beam splitters (7) and (8) of FIG. 1 to allow the values of $i_\theta^+$, $i_{(\theta+\pi/2)}^+$, $i_\theta^-$ and $i_{(\theta+\pi/2)}^-$ to be determined. These values are passed to a processor (34) which can determine the parameter S, the angle of the Faraday rotation and therefore the current flowing in the conductor.

It will be apparent that the invention can be put into practice in many other ways than those specifically described above. For example other ways of determining the polarization states of the counter propagating beams, as defined by the parameters of an ellipse circumscribed by the tip of the electric vector of light from the beams as the vector rotates, may be used to determine Faraday rotation. Also it may be possible to use guide means comprising two optical fibres with one of the counter-propagating beams in each fibre although practical problems with drift and variations between fibres make this possibility likely to be extremely difficult to operate. Other polarized light sources and arrangements of beam splitters, directional couplers and detectors may also be used.

As has been mentioned the counter-propagating light beams need not be linearly polarized. In one alternative the light beams launched into the fibres may be in a polarization state which is transformed by the fibre to provide linearly polarized outputs from the fibre.

I claim:

1. A method of measurement comprising passing polarized light beams in counter propagating directions through optical guide means which exhibit Faraday rotation of polarized light in the presence of a magnetic field, applying a component of a magnetic field longitudinally of the directions of light propagating in the guide means, the guide means having high circular birefringence compared with the Faraday rotation of the polarization of the light beams due to said component, deriving first light-dependent signals from light received after passing through the guide means in one propagation direction only and second light-dependent signals derived from light received after passing through the guide means in the other propagation direction only, the first and second signals being dependent on the polarization states of light received and allowing an output signal to be derived which is dependent on Faraday rotation but not on reciprocal polarization effects, and deriving the output signal from the first and second light-dependent signals as representative of a quantity to be measured.

2. A method according to claim 1 wherein each of the first and second signals comprises a pair of polarization-dependent first and second signals dependent on light polarized in first and second polarization directions selected to allow the required output signal to be derived.

3. A method according to claim 2 wherein the said first polarization direction is at an angle of $\pi/4$ to the direction of polarization of light transmitted to the guide means, and the second polarization direction is at an angle of $\pi/2$ to the first polarization direction.

4. A method according to claim 3 wherein deriving the output signal includes evaluating a parameter S, $$S = \frac{(i^{-}_{(\theta+\pi/2)} - i^{-}_{\theta}) - (i^{+}_{(\theta+\pi/2)} - i^{+}_{\theta})}{(i^{-}_{(\theta+\pi/2)} - i^{-}_{\theta}) + (i^{+}_{(\theta+\pi/2)} - i^{+}_{\theta})}$$

where $i^{+}_{\theta}$ and $i^{+}_{(\theta+\pi/2)}$ are proportional to the respective polarization-dependent signals of the first pair and $i^{-}_{\theta}$ and $i^{-}_{(\theta+\pi/2)}$ are proportional to the respective polarization-dependent signals of the second pair.

5. A method according to claim 1 wherein the guide means comprises an optical fibre which exhibits the magneto-optic effect.

6. A method according to any one of claims 1–5 wherein the counter propagating light beams are linearly polarized.

7. A method according to claim 1 wherein the circular birefringence of the guide means is high compared with linear birefringence which occurs during measurement.

8. A method according to claim 1 for measuring current including passing the current to be measured through a conductor to generate said component of said magnetic field and deriving the output signal as representative of said current.

9. A method according to claim 8 wherein the guide means is in the form of a coil round the conductor.

10. A method according to claim 1 including selecting the material of the guide means to have a variation of Faraday rotation with temperature which at least reduces the variation of the said output signal with temperature due to variation of circular birefringence of the material with temperature.

11. Measurement apparatus comprising means for passing polarized light beams in counter propagating directions through optical guide means which exhibit Faraday rotation of polarized light in the presence of a magnetic field component applied longitudinally of tile directions of light propagating in the guide means, detector means for deriving first light-dependent signals from light received after passing through the guide means in one propagation direction only and second light-dependent signals derived from light received after passing through the guide means in the other propagation direction only, the first and second signals being dependent on the polarization states of light received and allowing an output signal to be derived which is dependent on Faraday rotation, and processing means for deriving the output signal from the first and second light-dependent signals as representative of a quantity to be measured.

12. Measurement apparatus according to claim 11 wherein each of the first and second signals comprises a pair of polarization-dependent first and second signals dependent on light polarized in first and second polarization directions selected to allow the required output signal to be derived.

13. Apparatus according to claim 12 wherein the said first polarization direction is at an angle of $\pi/4$ to the direction of polarization of light transmitted to the guide means, and the second polarization direction is at an angle of $\pi/2$ to the first polarization direction.

14. Apparatus according to claim 13 wherein the detector means comprises first and second pairs of light sensitive means corresponding to the first and second pairs of polarization-dependent signals, respectively, each detector pair being arranged to receive light polarized in said first and second directions, respectively.

15. Apparatus according to claim 14 wherein the processing means is arranged to evaluate parameter S in deriving the output signal, where $$S = \frac{(i^{-}_{(\theta+\pi/2)} - i^{-}_{\theta}) - (i^{+}_{(\theta+\pi/2)} - i^{+}_{\theta})}{(i^{-}_{(\theta+\pi/2)} - i^{-}_{\theta}) + (i^{+}_{(\theta+\pi/2)} - i^{+}_{\theta})}$$

where $i^{+}_{\theta}$ and $i^{+}_{(\theta+\pi/2)}$ are respective electrical signals derived by one pair of light sensitive means, and $i^{-}_{\theta}$ and $i^{-}_{(\theta+\pi/2)}$ are respective electrical signals derived by the other pair of light sensitive means.

16. Apparatus according to claim 14 wherein the processing means is arranged to evaluate a parameter S in deriving the output signal, where $$S = \frac{(i^{-}_{(\theta+\pi/2)} - i^{-}_{\theta}) - (i^{+}_{(\theta+\pi/2)} - i^{+}_{\theta})}{(i^{-}_{(\theta+\pi/2)} - i^{-}_{\theta}) + (i^{+}_{(\theta+\pi/2)} - i^{+}_{\theta})}$$

where $i^{+}_{\theta}$ and $i^{+}_{(\theta+\pi/2)}$ are respective electrical signals derived by one pair of the light sensitive means, and the apparatus including the first and second directional couplers positioned to allow light to pass from laser means to the guide means for allowing light from the guide means to pass to the first and second pairs of light sensitive means at opposite ends of the guide means by way of means for ensuring the required polarization directions at the light sensitive means.

17. Apparatus according to claim 13 wherein the detector means comprises first and second pairs of light sensitive means corresponding to the first and second pairs of polarization-dependent signals, respectively, each detector pair being arranged to receive light polarized in the said first and second directions, respectively, including a further beam splitter positioned between one output of the other beam splitter and one end of the guide means, the said further beam splitter and another beam splitter being arranged to direct light from the guide means to respective ones of the pairs of light sensitive means by way of means for ensuring the required polarization directions at the light sensitive means.

18. Measurement apparatus according to claim 11 wherein the guide means comprises an optical fibre which exhibits the magneto-optic effect.

19. Measurement apparatus according to claim 11 wherein the circular birefringence of the guide means is high compared with linear birefringence which occurs, in operation, during measurement.

20. Measurement apparatus for current measurement according to claim 11 including a conductor to carry current to be measured and positioned to generate said magnetic field components, wherein the processing means derives the output signal representative of the said current.

21. Apparatus according to claim 20 wherein the guide means is in the form of a coil round the conductor.

22. Apparatus according to claim 11, wherein the means for passing light includes laser means for emitting linearly polarized light coupled by way of a beam splitter to opposite ends of the guide means.

23. Apparatus according to claim 11 wherein the Faraday rotation of the guide means varies with temperature in a way which at least reduces the effect of temperature on the output signal of the processing means due to variation of circular birefringence of the guide means with temperature.

* * * * *